United States Patent [19]
Takeuchi et al.

[11] Patent Number: 6,118,277
[45] Date of Patent: Sep. 12, 2000

[54] APPEARANCE INSPECTION APPARATUS FOR ELECTRONIC PARTS AND APPEARANCE INSPECTION METHOD FOR ELECTRONIC PARTS

[75] Inventors: Yukihisa Takeuchi, Aichi-pref; Hiroyuki Tsuji, Nagoya; Takao Ohnishi, Aichi-pref, all of Japan

[73] Assignee: NGK Insulators, Ltd., Japan

[21] Appl. No.: 09/181,350

[22] Filed: Oct. 28, 1998

[30] Foreign Application Priority Data

Oct. 31, 1997 [JP] Japan ................................... 9-300779

[51] Int. Cl.[7] .................................................. G01R 31/28
[52] U.S. Cl. ............................................ 324/501; 324/752
[58] Field of Search ..................................... 324/727, 752, 324/500, 501; 356/394, 237.1, 237.5, 237.2

[56] References Cited

U.S. PATENT DOCUMENTS

| | | | |
|---|---|---|---|
| 3,629,584 | 12/1971 | Blomgren | 374/5 |
| 5,032,788 | 7/1991 | Ringled et al. | 324/752 |
| 5,376,883 | 12/1994 | Kaito | 324/501 |
| 5,521,517 | 5/1996 | Shida et al. | 324/751 |
| 5,640,099 | 6/1997 | Sanada | 324/752 |
| 5,781,017 | 7/1998 | Cole et al. | 324/751 |

*Primary Examiner*—Safet Metjahic
*Assistant Examiner*—Vincent Q. Nguyen
*Attorney, Agent, or Firm*—Wall Marjama Bilinski & Burr

[57] ABSTRACT

Disclosed is an appearance inspection apparatus for inspecting whether an appearance state of a main actuator element is adequate or defective by applying an appearance-inspecting voltage to the main actuator element including an upper electrode formed on an upper surface of a shape-retaining layer and a lower electrode formed on a lower surface of the shape-retaining layer. The appearance inspection apparatus comprises an optical detecting unit for electrically detecting the appearance state of the main actuator element on the basis of light emission caused by the main actuator element, and a judging unit for judging whether the appearance state of the main actuator element is adequate or defective on the basis of a level of a detection signal supplied from the optical detecting unit. Accordingly, it is possible to realize high inspection accuracy, reduce inspection time, and simplify the inspection apparatus. Further, the present invention is also applicable to integrated electronic parts.

10 Claims, 11 Drawing Sheets

APPEARANCE INSPECTION APPARATUS FOR ELECTRONIC PARTS AND APPEARANCE INSPECTION METHOD FOR ELECTRONIC PARTS

BACKGROUND OF THE INVENTION

1. Field of the Invention

The present invention relates to an apparatus and a method for inspecting the appearance of electronic parts. In particular, the present invention relates to an apparatus and a method for inspecting the appearance of electronic parts, which are preferably used to inspect any appearance defect of a measurement objective which equivalently constitutes a capacitor.

2. Description of the Related Art

A piezoelectric/electrostrictive element has been hitherto known, for example, in the fields of optics and precision manufacturing, as a displacement element capable of adjusting the optical path length or the position on the order of submicron.

Figure 10:
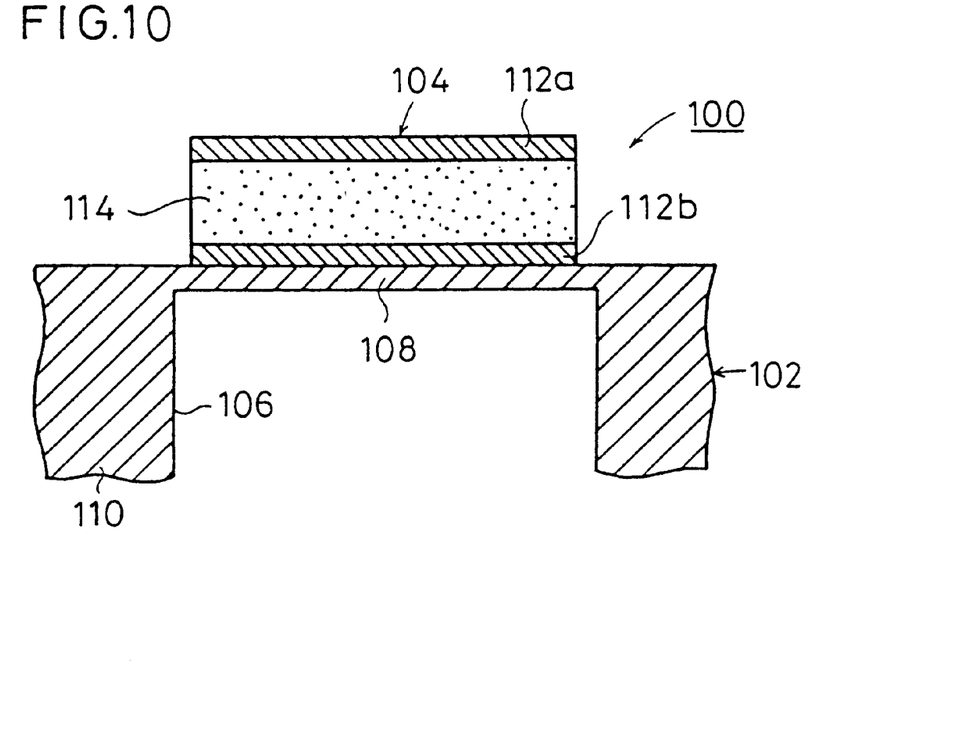
FIG. 10 shows a sectional view illustrating a structure of a piezoelectric/electrostrictive element.

A representative structure of the piezoelectric/electrostrictive element is shown in FIG. 10. The piezoelectric/electrostrictive element 100 comprises a substrate 102 formed of ceramic or the like, and a piezoelectric/electrostrictive operating section 104 formed on a first principal surface of the substrate 102.

The substrate 102 has at least one hollow space 106 on the inside. A thin-walled section of the substrate 102, which is formed to cover the hollow space 106, functions as a vibrating section 108. A thick-walled section of the substrate 102, other than the vibrating section 108, functions as a fixed section 110 for supporting the vibrating section 108.

The piezoelectric/electrostrictive operating section 104 is formed in an integrated manner by successively stacking, on the first principal surface of the substrate 102, a thin film-shaped lower electrode 112b, a piezoelectric/electrostrictive layer 114, and an upper electrode 112a. This is followed by sintering. When the piezoelectric/electrostrictive operating section 104 is recognized as an equivalent circuit, it constitutes a capacitor.

Figure 11:
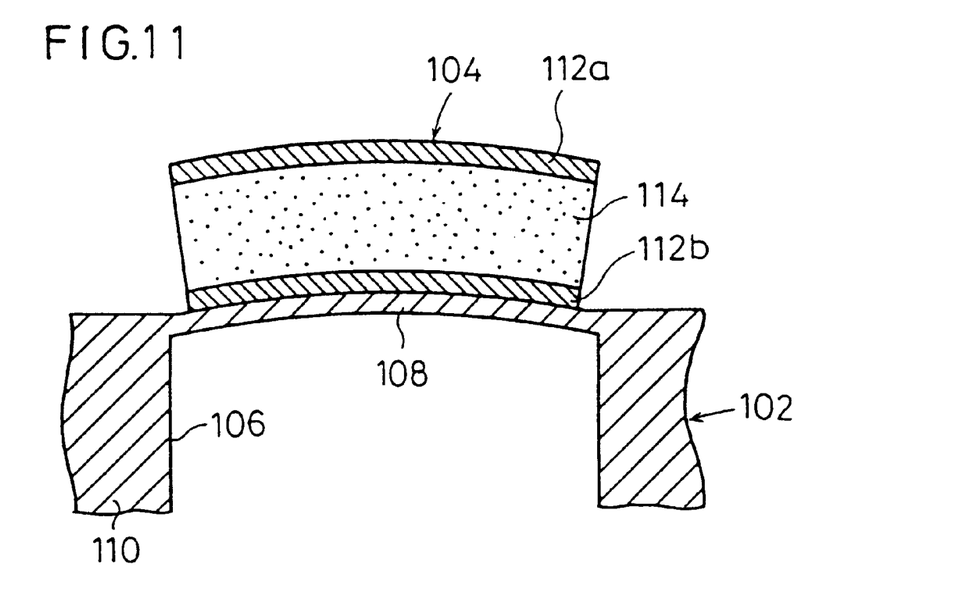
FIG. 11 shows a sectional view illustrating a state in which the piezoelectric/electrostrictive element is displaced in a first direction.

A brief explanation will now be given of the principle of operation of the piezoelectric/electrostrictive element 100. Intially, the piezoelectric/electrostrictive element 100 is subjected to a polarization treatment for the piezoelectric/electrostrictive layer 114 by applying, for a predetermined period of time, a polarization voltage which is higher than a driving voltage between the upper electrode 112a and the lower electrode 112b. After that, the driving voltage is applied between the upper electrode 112a and the lower electrode 112b so that the electric field-induced strain is generated. As a result, as shown in FIG. 11, the displacement occurs, for example, in a first direction (direction for the upper electrode 112a to face the free space).

Figure 12:
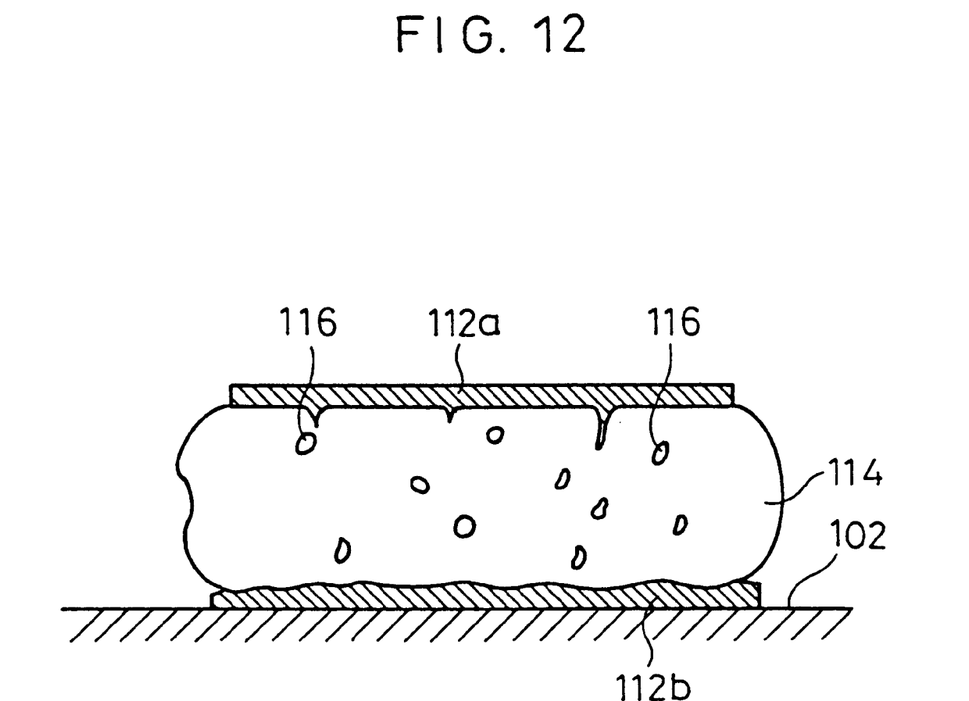
FIG. 12 illustrates a state in which bubbles are formed in a piezoelectric/electrostrictive layer.
Figure 13A:
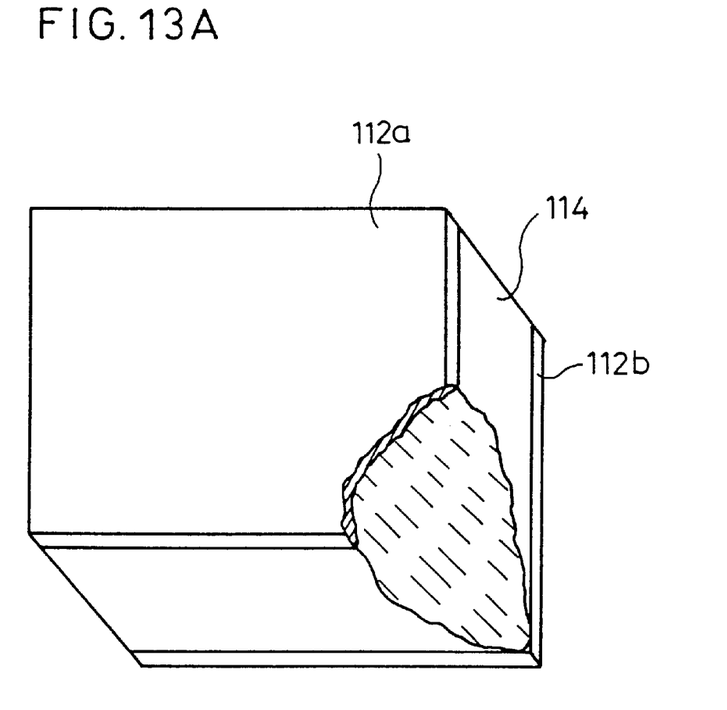
FIG. 13A shows a perspective view illustrating a state in which a part of an upper electrode is lost due to breakdown of the piezoelectric/electrostrictive element (allowable level)
Figure 13B:
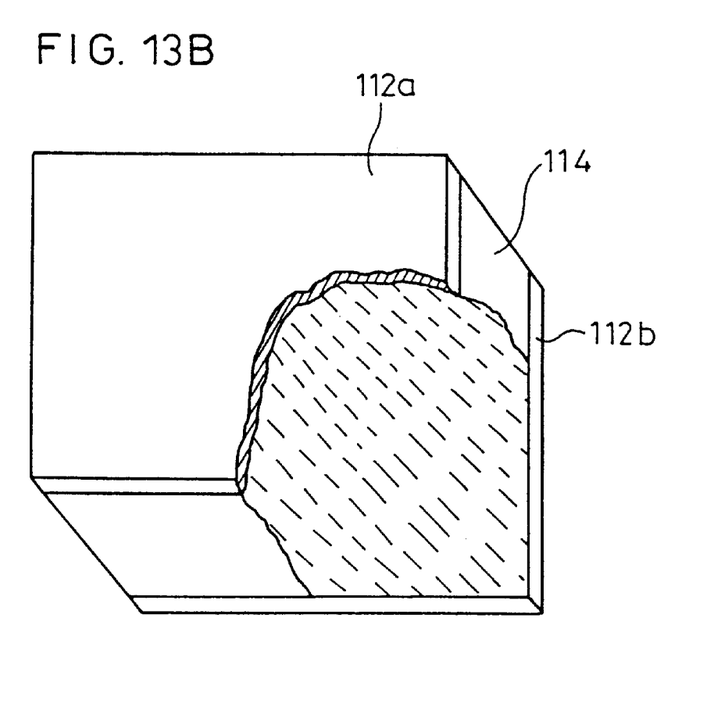
FIG. 13B shows a perspective view illustrating a state in which a part of the upper electrode is lost due to breakdown of the piezoelectric/electrostrictive element (appearance defect).

As shown in FIG. 12, minute bubbles 116 exist in the piezoelectric/electrostrictive layer 114 in some cases. When a relatively high voltage is applied for a certain period of time in order to perform a polarization treatment or a withstand voltage test, it is feared that any breakdown that occurs is a result of the bubbles 116. If the breakdown occurs, as shown in FIGS. 13A and 13B, the upper electrode 112a is broken simultaneously with the piezoelectric/electrostrictive layer 114. If the degree of breakage (hereinafter referred to as "breakage ratio" (breakage area/electrode area)) is larger than a predetermined value (appearance reference value), the function of the piezoelectric/electrostrictive element 100 is damaged. Therefore, it is necessary to exclude any products appearing to have bubbles.

In other cases, as shown in FIG. 12, the metal (for example, Au), which constitutes the upper electrode 112a and the lower electrode 112b, permeates the piezoelectric/electrostrictive layer 114 of the piezoelectric/electrostrictive element 100. If the insulation performance of the piezoelectric/electrostrictive layer 114 is damaged by the permeation of the metal, it is impossible to have the piezoelectric/electrostrictive element 100 to function normally. In these cases, it is necessary to exclude any products having an insulation defect.

In order to inspect those having the defects described above, a visual observation has been hitherto used to determine the appearance defect, and insulation resistance has been hitherto used to test for the insulation defect. In the appearance inspection method based on the visual observation, an inspection operator inspects the appearance defect by observing the surface of the upper electrode 112a of the piezoelectric/electrostrictive element 100 by using a microscope or the like. If the upper electrode 112a is broken, the presence or absence of the appearance defect of the piezoelectric/electrostrictive element 100 is judged by comparing the breakage ratio of the upper electrode 112a with an appearance reference value by means of visual observation.

On the other hand, the insulation inspection method based on the detection of the insulation resistance is performed as follows. A predetermined voltage (for example, 1 V) is applied between the upper electrode 112a and the lower electrode 112b of the piezoelectric/electrostrictive element 100. In this state, the value of a current flowing between the both electrodes 112a, 112b is detected by using an ammeter. Thus, the insulation defect of the piezoelectric/electrostrictive element 100 is inspected. In this method, the insulation defect of the piezoelectric/electrostrictive element 100 is judged depending on the presence or absence of the current. That is, it is determined that the insulation defect exists if the detected current value is larger than zero. If the detected current value is zero, it is determined that no insulation defect exists.

However, in the case of the appearance inspection method based on the visual observation, the inspection operator has to inspect each piezoelectric/electrostrictive element 100 individually. Therefore, a limit on examination is imposed in order to shorten the inspection time. Moreover, there is a possibility that the judgement is made on the basis of a subjective standard of the inspection operator. For this reason, it is feared that the accuracy of the inspection is lowered.

The following appearance inspection methods may be conceived in order to solve the problems as described above. The first method is a method for inspecting the defect of the piezoelectric/electrostrictive element 100 by detecting the capacitance value of the piezoelectric/electrostrictive element 100 by using an ammeter (hereinafter referred to as "ammeter-based appearance inspection method"). The second method is a method for inspecting the defect of the piezoelectric/electrostrictive element 100 by detecting the breakdown sound associated with the breakdown causing the appearance defect (hereinafter referred to as "sound-based appearance inspection method").

The ammeter-based appearance inspection method is performed as follows to detect the capacitance value. At first, the upper electrode 112a and the lower electrode 112b are charged with saturated electric charge therebetween. A value of a current which flows when the electric charge is discharged is detected by using the ammeter. If the upper electrode 112a of the piezoelectric/electrostrictive element 100 is broken, the capacitance value is lowered depending on the breakage ratio. Accordingly, the detected capacitance value is compared with a capacitance value (appearance reference capacitance value) corresponding to a preset appearance reference value. Thus, the piezoelectric/electrostrictive element 100 is inspected for the presence or absence of the appearance detect.

The ammeter-based appearance inspection method is advantageous in that the defect in appearance can be detected objectively.

On the other hand, the sound-based appearance inspection method is carried out as follows. A polarization treatment or a withstand voltage test is performed for the piezoelectric/electrostrictive element 100. The piezoelectric/electrostrictive element 100 is inspected for the appearance defect on the basis of the sound pressure of the breakdown sound or the sound pressure at a specified frequency (power spectrum) brought about in accordance with the breakdown of the piezoelectric/electrostrictive layer 114, which is caused during this process.

When the breakdown sound is detected, the presence or absence of the appearance defect is judged by comparing the generated breakdown sound with a sound pressure value (appearance reference sound pressure value) previously set on the basis of the appearance reference value.

The sound-based appearance inspection method is also advantageous in that the appearance of the piezoelectric/electrostrictive element can be objectively inspected in the same manner as in the ammeter-based appearance inspection method.

However, many problems remain to be solved in order to practically use either the ammeter-based appearance inspection method and the sound-based appearance inspection method.

In the ammeter-based appearance inspection method, the appearance defect is inspected by comparing the capacitance value of the piezoelectric/electrostrictive element 100 with the appearance reference capacitance value. However, the appearance reference capacitance value does not correspond to the appearance reference value in some cases. That is, the appearance defect occasionally exists even when the capacitance value of the piezoelectric/electrostrictive element 100 satisfies the appearance reference capacitance value.

Such a situation occurs due to the self-repairing function of the capacitor. The self-repairing function is based on a phenomenon caused when the electrode of the capacitor is broken. In such a case, the broken cross section of the electrode functions as a new electrode surface, and the ratio of decrease in capacitance value becomes smaller than those assumed from an actual breakage ratio of the electrode area. Therefore, when the appearance defect is inspected by means of the ammeter-based appearance inspection method, there is a possibility that any piezoelectric/electrostrictive element 100 having the appearance defect is erroneously judged to be an adequate product, and the appearance defect is missed. If the appearance reference capacitance value is strictly set in order to avoid the misidentification of the appearance defect, usable piezoelectric/electrostrictive elements 100 are excluded, resulting in an uneconomical identification.

The change in capacitance value, which results from the appearance defect of the piezoelectric/electrostrictive element 100, is minute. Therefore, the change in electric charge, which is charged between the upper electrode 112a and the lower electrode 112b, is also minute. In order to detect the change in electric charge, it is necessary to use an ammeter having extremely high performance. However, it is difficult to construct such an ammeter at present. Further, even if such an ammeter can be constructed, it is assumed that it would be extremely expensive.

In the ammeter-based appearance inspection method described above, the current must be detected directly for the individual piezoelectric/electrostrictive element 100. Therefore, both the inspection apparatus and the inspection steps become necessarily complicated. Further, it is difficult to apply the ammeter-based appearance inspection method to any integrated piezoelectric/electrostrictive element 100.

Therefore, it is difficult that the ammeter-based appearance inspection method is put into practice at present in view of the accuracy, technology, economics, and efficiency.

On the other hand, in the sound-based appearance inspection method, the appearance defect is inspected on the basis of the detected sound pressure. Therefore, this method is greatly affected by noise due to its character. Accordingly, in order to successfully detect the minute change in sound pressure, it is necessary to use an inspection environment which is extremely excellent in sound insulation performance and sound isolation performance. However, it is technically difficult to realize such an inspection environment. Further, even if such an inspection environment can be technically realized, it is assumed that it would be extremely expensive.

Therefore, it is also difficult that the sound-based appearance inspection method is put into practice at present in view of the accuracy, technology, and economics.

SUMMARY OF THE INVENTION

The present invention has been made taking such problems into consideration. It is an object of the present invention to provide an appearance inspection apparatus for electronic parts and an appearance inspection method for electronic parts which make it possible to realize a high inspection accuracy, reduce inspection time, and simplify the inspection apparatus, and also, be applicable to integrated electronic parts.

The present invention is an appearance inspection apparatus for electronic parts, for inspecting appearance defect of a measurement objective by applying an inspecting voltage to the measurement objective including electrode films formed on surfaces of a dielectric layer. The appearance inspection apparatus is comprised of an optical detecting means for electrically detecting an appearance state of the measurement objective on the basis of light emission caused by the measurement objective, and a judging means for judging whether the appearance state of the measurement objective is adequate or defective on the basis of a level of an electric signal supplied from the optical detecting means.

Therefore, and according to a first embodiment of the present invention, an inspecting voltage is applied to the measurement objective, including the electrode films formed on the surfaces of the dielectric layer. If the measurement objective undergoes breakdown by the application of the inspecting voltage, light emission occurs in association with the breakdown. The optical detecting means detects the light emission caused by the measurement objective and converts the emission into an electric signal at a level corresponding to the amount of light. The electric signal is supplied to the judging means disposed at the downstream stage. The judging means judges whether the appearance state of the measurement objective is adequate or defective on the basis of the level of the electric signal supplied from the optical detecting means.

Therefore, when the appearance inspection apparatus for electronic parts according to the present invention is used, it is possible to realize a high inspection accuracy, reduce inspection time, and simplify of the inspection apparatus in the defect inspection for electronic parts. Furthermore it is also possible to perform the inspection for integrated electronic parts.

The optical detecting means comprises, for example, at least one or more photodiodes. The judging means may comprise an integrating circuit for applying an integrating process to the electric signal supplied from the optical detecting means, and a comparing circuit for comparing an output level of the integrating circuit with a reference value.

In another embodiment of the present invention, there is disclosed an appearance inspection method for electronic parts. In order to detect an appearance defect of a measurement objective, an inspecting voltage is applied to the measurement objective including electrode films formed on surfaces of a dielectric layer. The appearance inspection method comprises an optical detecting step of electrically detecting an appearance state of the measurement objective on the basis of light emission caused by the measurement objective, and a judging step of judging whether the appearance state of the measurement objective is adequate or defective on the basis of a level of an electric signal obtained by the first step.

Accordingly, an inspecting voltage is applied to the measurement objective including the electrode films formed on the surfaces of the dielectric layer. If the measurement objective undergoes breakdown by the application of the inspecting voltage, the light emission occurs in association with the breakdown. In optical detecting step, the light emission caused by the measurement objective is detected and converted into an electric signal at a level corresponding to the amount of light. In the judging step, it is judged whether the appearance state of the measurement objective is adequate or defective on the basis of the level of the electric signal obtained in the optical detecting step.

Therefore, when the appearance inspection method for electronic parts according to the present invention is used, it is possible to realize a high inspection accuracy, reduce inspection time, and simplify the inspection apparatus in the appearance defect inspection for electronic parts, and also perform the inspection for integrated electronic parts.

In the optical detecting step, for example, at least one or more photodiodes may be used to electrically detect the light emission from the measurement objective.

The judging step may comprise a first step of applying an integrating process to the electric signal obtained in the optical detecting step, and a second step of comparing an output level obtained in the first step with a reference value.

The above and other objects, features, and advantages of the present invention will become more apparent from the following description when taken in conjunction with the accompanying drawings in which a preferred embodiment of the present invention is shown by way of illustrative example.

DETAILED DESCRIPTION OF THE INVENTION

An illustrative embodiment, in which the appearance inspection apparatus and the appearance inspection method for electronic parts according to the present invention are applied to the appearance inspection for an actuator, will be explained with reference to FIGS. 1 to 9. Prior thereto, brief explanation will be made with reference to FIGS. 1 to 4B for the structure of the actuator 10.

Figure 1:
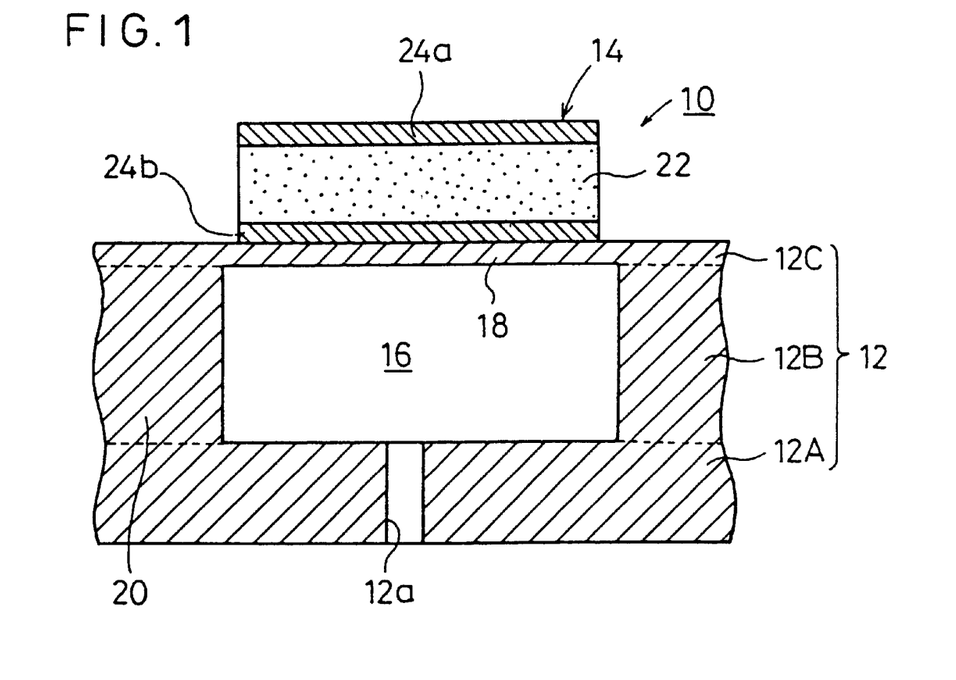
FIG. 1 shows a sectional view illustrating a structure of an actuator to which an appearance inspection method according to an embodiment of the present invention and an appearance inspection apparatus according to an embodiment of the present invention are applied.

As shown in FIG. 1, the actuator 10 is composed of, for example, ceramic, and it has a substrate 12 with a first principal surface which is a continuous surface (flushed surface). A main actuator element 14 is arranged at an arbitrary position of the substrate 12.

A hollow space 16 for forming a vibrating section, which will be described later, is provided in the substrate 12 at a position corresponding to the position of formation of the main actuator element 14. Each of the hollow spaces 16 communicates with the outside via a through-hole 12a having a small diameter provided through a second end surface of the substrate 12.

A portion of the substrate 12, at which the hollow space 16 is formed, is thin-walled. The other portion is thick-walled. The thin-walled portion has a structure which is susceptible to vibration in response to an external stress, and thus it functions as a vibrating section 18. The portion other than the hollow space 16 is thick-walled, and it functions as a fixed section 20 for supporting the vibrating section 18.

The substrate 12 has a stacked structure comprising a substrate layer 12A as a lowermost layer, a spacer layer 12B as an intermediate layer, and a thin plate layer 12C as an uppermost layer. The substrate 12 is constructed as an integrated structure in which the hollow space 16 is formed at a predetermined position of the spacer layer 12B. The substrate layer 12A functions as a reinforcing substrate, and it also functions as a substrate for wiring. The substrate 12 may be produced by means of integrated sintering, or it may be produced by means of additional attachment.

As shown in FIG. 1, each of the main actuator elements 14 comprises the vibrating section 18 and the fixed section 20 as described above. The main actuator element 14 further comprises a shape-retaining layer 22 composed of, for example, a piezoelectric/electrostrictive layer or an antiferroelectric layer formed over the vibrating section 18, an upper electrode 24a formed on an upper surface of the shape-retaining layer 22, and a lower electrode 24b formed on a lower surface of the shape-retaining layer 22.

Figure 2:
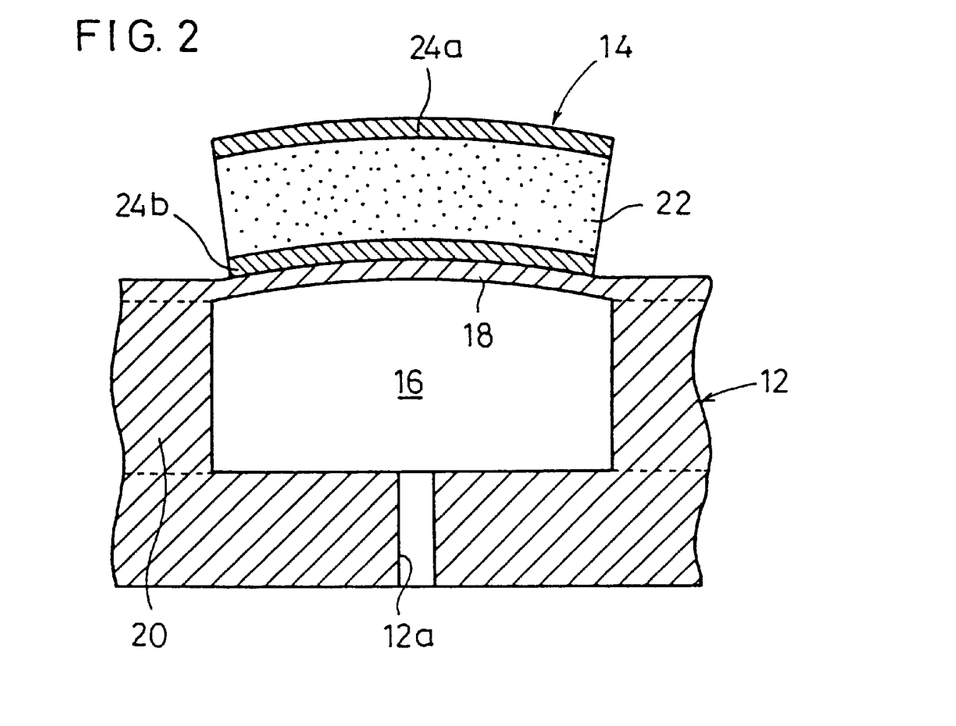
FIG. 2 shows a sectional view illustrating a state in which a main actuator element of the actuator is displaced in a first direction.
Figure 3:
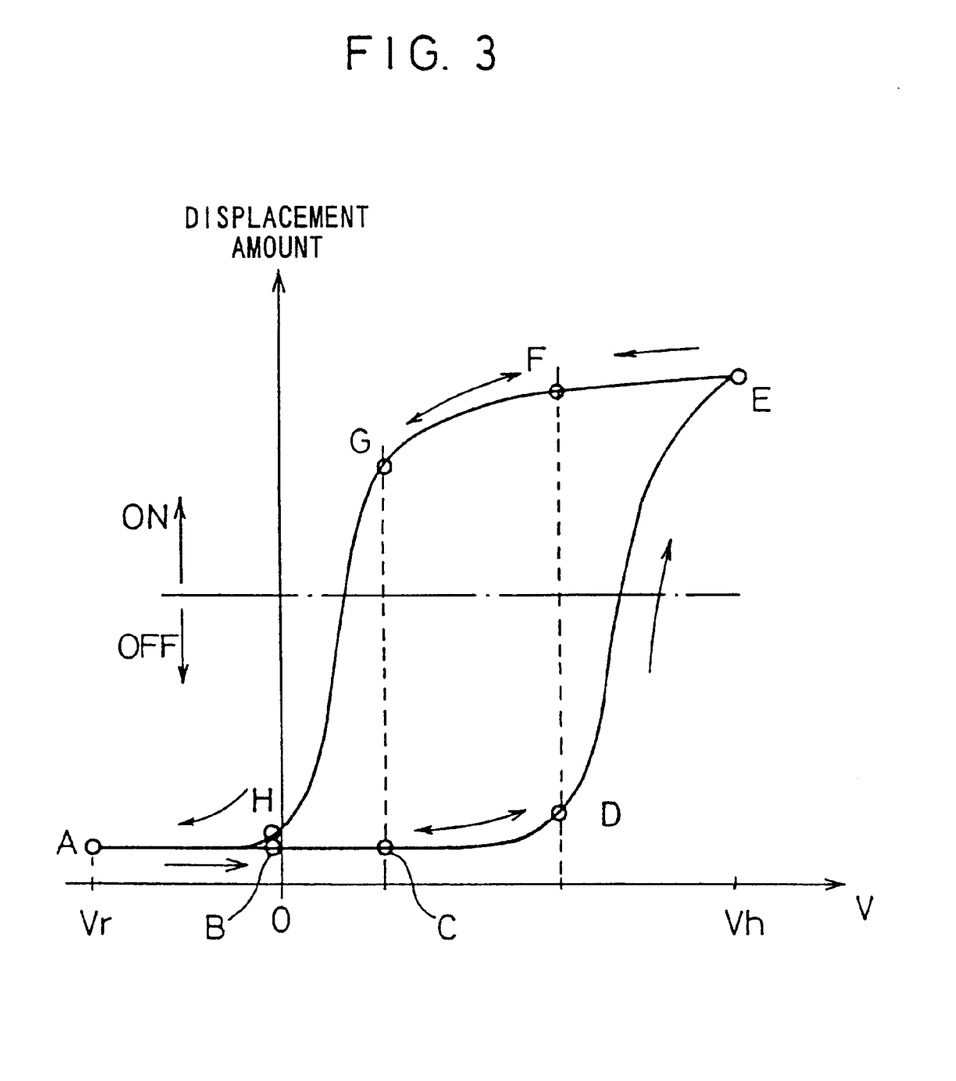
FIG. 3 shows a characteristic curve illustrating a bending displacement characteristic of the main actuator element.

Next, explanation will be made on the basis of a bending displacement characteristic shown in FIG. 3 for the operation principle in each of the main actuator elements 14 when the piezoelectric layer is used as the shape-retaining layer 22. The bending displacement characteristic shown in FIG. 3 is obtained by observing the bending displacement of the main actuator element 14 when the voltage applied to the main actuator element 14 is continuously changed after applying the voltage for the polarization treatment or the withstand voltage test between the upper electrode 24a and the lower electrode 24b of the main actuator element 14. In this embodiment, it is assumed that the positive direction is given when the main actuator element 14 makes bending displacement in the first direction (direction for the upper electrode 24a to face the free space) as shown in FIG. 2.

The measurement of the bending displacement characteristic will be specifically explained as exemplified by an illustrative example. At first, when the voltage is applied between the upper electrode 24a and the lower electrode 24b in order to perform the polarization treatment for the shape-retaining layer 22, the electric field in the positive direction is generated in the superficial direction over the first principal surface of the shape-retaining layer 22.

The polarization treatment is achieved in the same direction as that of the generated electric field by applying the voltage exceeding the range of use (Vr to Vh) of the voltage normally used for the actuator 10, for example, for 7 hours at an appropriate temperature.

After that, the voltage application between the upper electrode 24a and the lower electrode 24b is stopped to give a no voltage-loaded state. A sin wave, which has a frequency of 1 kHz, a positive peak voltage of Vh, and a negative peak voltage of Vr, is applied between the upper electrode 24a and the lower electrode 24b of the main actuator element 14 simultaneously with the start of the measurement. The displacement amount at each point (Point A to Point H) is continuously measured by using a laser displacement meter.

FIG. 3 shows a bending displacement characteristic obtained by plotting the measurement result obtained as described above, on an electric field-bending displacement graph. As shown by arrows in FIG. 3, the displacement amount of the bending displacement continuously changes with a certain degree of hysteresis depending on the continuous increase and decrease in applied voltage.

Specifically, at first, it is assumed that the measurement is started from the no voltage-loaded state (applied voltage=0 V) indicated by Point B. At Point B, a uniform electric field is merely generated by the polarization treatment in the shape-retaining layer 22, and hence no elongation occurs in the shape-retaining layer 22.

Subsequently, when the positive peak voltage (Vh) is applied between the upper electrode 24a and the lower electrode 24b of the main actuator element 14, the main actuator element 14 makes bending displacement in the first direction (direction for the upper electrode 24a to face the free space) (see FIG. 2) as indicated by Point E.

Next, when the voltage application between the upper electrode 24a and the lower electrode 24b of the main actuator element 14 is stopped to give the no voltage-loaded state, the main actuator element 14 intends to return from the convex state to the original state (state of Point B). However, the main actuator element 14 does not completely return to the state of Point B due to the hysteresis characteristic. The main actuator element 14 is in a state in which it is slightly displaced in the first direction from Point B (state of Point H).

Subsequently, when the negative peak voltage (Vr) is applied between the upper electrode 24a and the lower electrode 24b of the main actuator element 14, the slight displacement in the first direction in the no voltage-loaded state is counteracted as indicated by Point A, and the main actuator element 14 completely restores the original state.

Figure 4A:
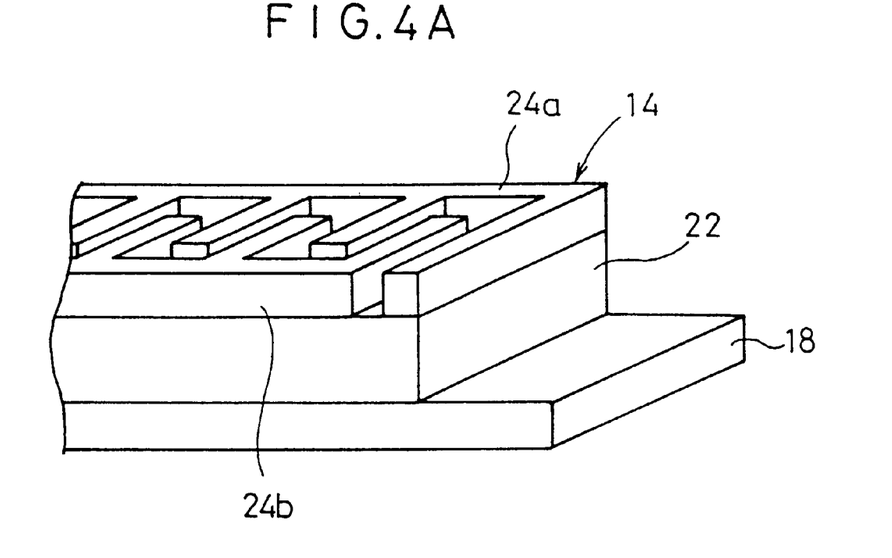
FIG. 4A shows a perspective view illustrating, with actuator element.
Figure 4B:
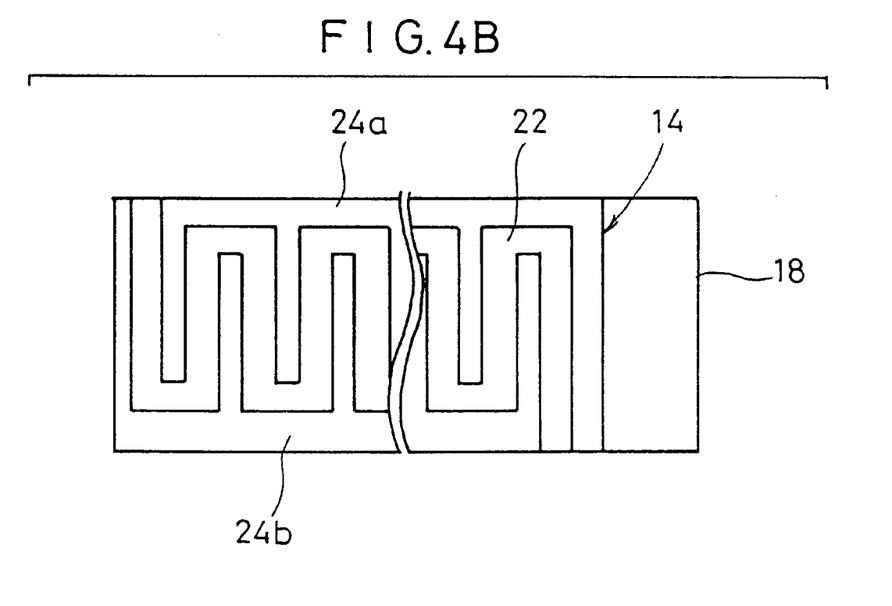
FIG. 4B shows a plan view illustrating the main actuator element shown in FIG. 4A.

The main actuator element 14 described above has the structure in which the upper electrode 24a and the lower electrode 24b are formed on the upper and lower surfaces of the shape-retaining layer 22 respectively. Alternatively, as shown in FIGS. 4A and 4B, it is also allowable to adopt a structure in which a pair of comb-shaped electrodes 24a, 24b are arranged in a complementary configuration while being separated from each other on an upper surface of a shape-retaining layer 22.

The appearance inspection method according to the embodiment of the present invention is carried out as follows. Light which is emitted in association with breakdown of the main actuator element 14, is detected during the withstand voltage test or the polarization treatment to make conversion into an electric signal (detection signal) at a level corresponding to an amount of the light. The level of the detection signal is compared with a reference value to judge whether the appearance state of the main actuator element 14 is adequate or defective. The appearance inspection method is applicable to any one of the electrode structure shown in FIG. 1 and the electrode structure shown in FIG. 4A. However, in order to simplify the explanation, the illustrative application to the electrode structure shown in FIG. 1 will be principally explained.

At first, the light emission phenomenon caused by the main actuator element 14 will be explained. When the breakdown occurs upon application of a constant voltage or a pulse voltage (for example, 50 V) for the withstand voltage test or the polarization treatment between the upper electrode 24a and the lower electrode 24b of the main actuator element 14, light emission takes place in accordance with the breakdown. This occurs because when the upper electrode 24a is broken due to the breakdown, the electrode area of the upper electrode 24a is suddenly decreased. As a result, the balance of electric charge between the upper electrode 24a and the lower electrode 24b is destroyed and light energy is radiated in compensation therefor. It is known that the amount of light emission is proportional to the breakage ratio of the upper electrode 24a. Accordingly, it is possible to inspect the appearance defect by detecting and measuring the amount of light.

Next, explanation will be made for a method for detecting the light brought about by the breakdown. The method for detecting the light is performed by detecting, with a photodiode, the breakdown light generated when the voltage for the withstand voltage test or the polarization treatment is applied to each of the main actuator elements 14 of the actuator 10 as the measurement objective placed in a dark room.

The detection of light is performed in the dark room in order to prevent occurrence of any error due to external light. In the appearance inspection method according to the embodiment of the present invention, the light amount value is specified on the basis of the light emission time not on the basis of the intensity of radiated light, as described later on. Therefore, it is possible to highly accurately detect any instantaneously emitted light. The photodiode, which is used in the appearance inspection method according to the embodiment of the present invention, is constructed to output the current value which is proportional to the light amount of detected light.

It is desirable that the light detection with the photodiode is performed in a plurality of directions in consideration of the directivity of light. In other words, it is desirable to perform the detection by using a plurality of photodiodes. In order to reliably perform the light detection, it is desirable that the photodiode is installed to be directed to the upper electrode 24a of the main actuator element 14.

When the appearance inspection method according to the embodiment of the present invention is applied to an apparatus (for example, a display unit) integrated with a plurality of main actuator elements 14 on the substrate 12, then the light detection may be performed for each of the main actuator elements 14, or the light direction may be performed for an objective of the whole apparatus integrated with the plurality of main actuator elements 14.

The former method is effective when a main actuator element 14 recognized to have any appearance defect is specified so that the main actuator element 14 having the appearance defect is repaired in the production steps performed at the downstream stage. The latter method is effective when the inspection is collectively performed for the completed product.

Next, explanation will be made for a method (judging method) for judging the appearance state on the basis of the detection signal obtained by the light detection.

The judging method is performed by integrating and composing the detection signal (current signal or voltage signal) obtained by the light detection to determine a light amount value (appearance light amount value), and comparing the appearance light amount value with a reference value to judge whether the appearance state is adequate or defective.

The integrating process avoids any influence of the detection error of the light amount value which would be otherwise caused by the difference in directed direction of light. Further, the integrating process makes it possible to measure the light emission time even when the intensity of detected light exceeds the allowable value of the photodiode (saturated state). Therefore, it is possible to correctly determine the light amount value based on the light emission time.

Figure 5A:
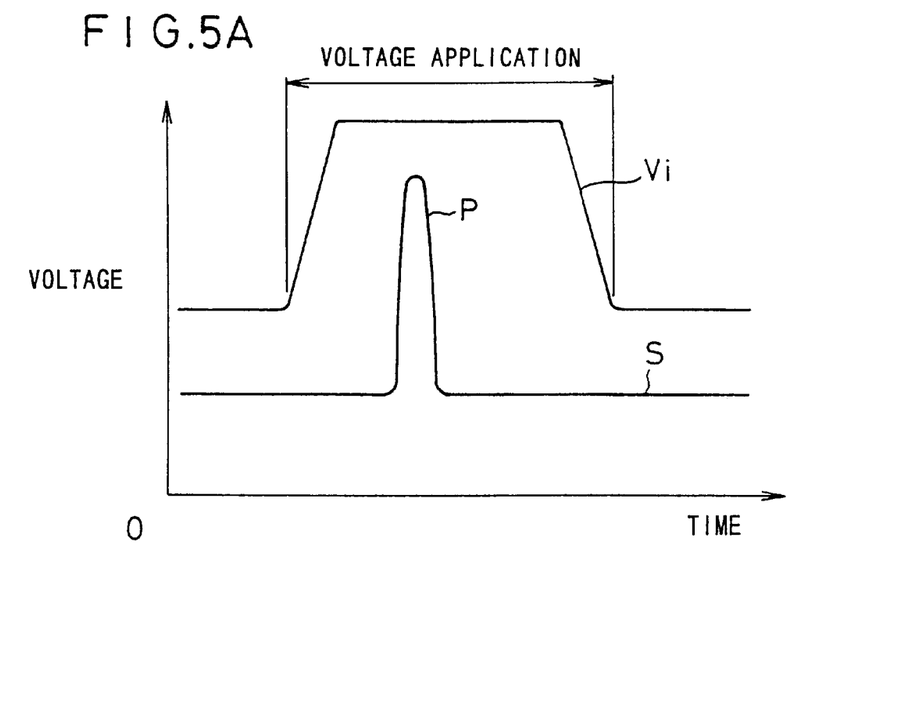
FIG. 5A shows characteristic curves illustrating a waveform of a voltage applied to the main actuator element and an output waveform of an avalanche photodiode.

For example, it is assumed that an avalanche photodiode, which is advantageous, for example, in high sensitivity and low noise and which is advantageously usable for high frequency, is used as the photodiode. As shown in FIG. 5A, when the voltage Vi for the polarization treatment or the withstand voltage test is applied between the upper electrode 24a and the lower electrode 24b of the main actuator element 14, the light is instantaneously radiated in accordance with the breakdown as described above. On this condition, the avalanche photodiode outputs a detection signal S having a pulse waveform P with an extremely narrow pulse width, in response to the instantaneous radiation of light.

Figure 5B:
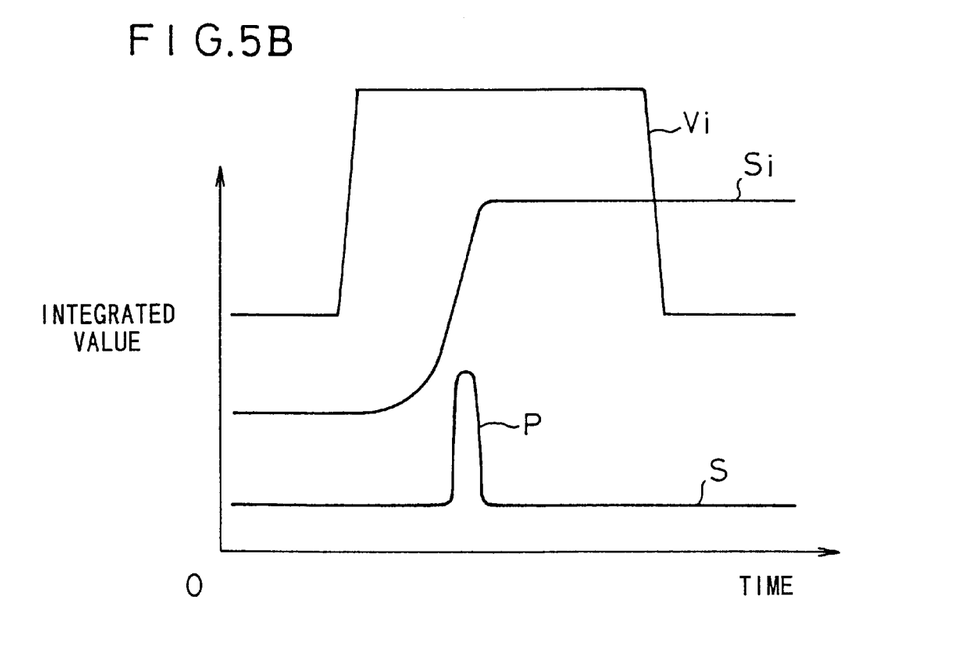
FIG. 5B shows characteristic curves illustrating a waveform of a voltage applied to the main actuator element, an output waveform of the avalanche photodiode, and an integrated waveform thereof.

It is difficult to detect the peak value of the detection signal S. However, as shown in FIG. 5B, an integrated waveform Si, which is obtained by integrating and processing the detection signal S, has a direct current waveform based on the energy of the pulse waveform P. Therefore, it is extremely easy to perform the following signal processing (especially, the process for making comparison with the reference value). Thus, it is possible to exclude the detection error almost completely.

On the other hand, in the composing process, the appearance light amount value is determined, for example, by adding up and averaging the output after being subjected to the integrating process. Accordingly, errors contained in detected light fluxes obtained by the respective photodiodes are offset, and it is possible to determine the light amount value with a high degree of accuracy.

Figure 6:
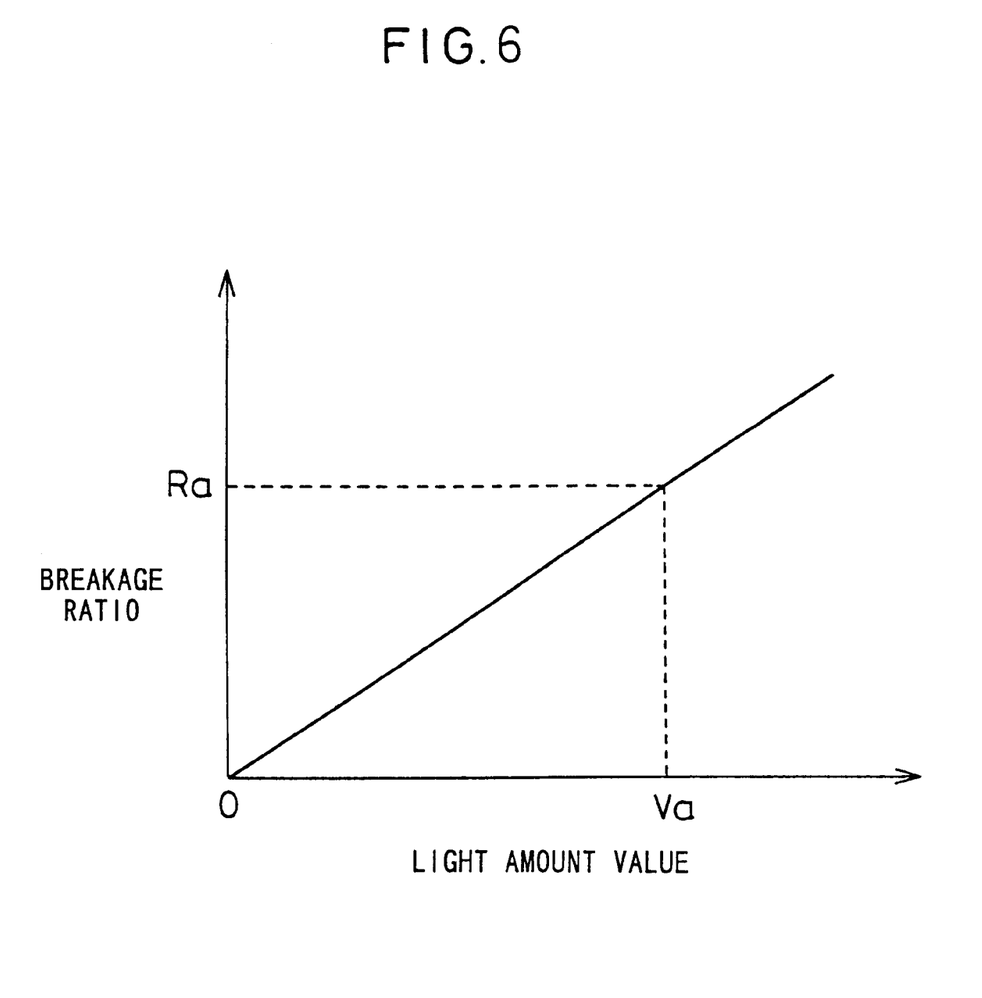
FIG. 6 shows a characteristic curve illustrating a relationship between an amount of light emitted when the main actuator element is subjected to breakdown and a breakage ratio of an upper electrode.

The judgement for the appearance defect is performed as follows. At first, as shown in FIG. 6, the appearance allowable critical value (boundary value allowable for the appearance to be judged as "adequate") Ra is set previously from the breakage ratio of the upper electrode 24a. The light amount value (i.e., the appearance reference value) Va corresponding to the appearance allowable critical value Ra is determined beforehand. The judgement is made by comparing the detection signal itself or the appearance light amount value V obtained by integrating and composing the detection signal, with the appearance reference value Va. It is desirable for the judgement to use the appearance light amount value V obtained by integrating and composing the detection signal. Thus if the appearance light amount value V is not less than the appearance reference value Va, it is judged that the appearance state is "defective", because the breakage ratio of the upper electrode 24a is not less than the appearance allowable critical value Ra. If the appearance light amount value V is less than the appearance reference value Va, it is judged that the appearance state is "adequate", because the breakage ratio is less than the appearance allowable critical value Ra.

Next, explanation will be made with reference to FIGS. 7 to 9 for the inspection apparatus to which the appearance inspection method according to the embodiment of the present invention is applied (hereinafter simply referred to as "appearance inspection apparatus according to the embodiment").

Figure 7:
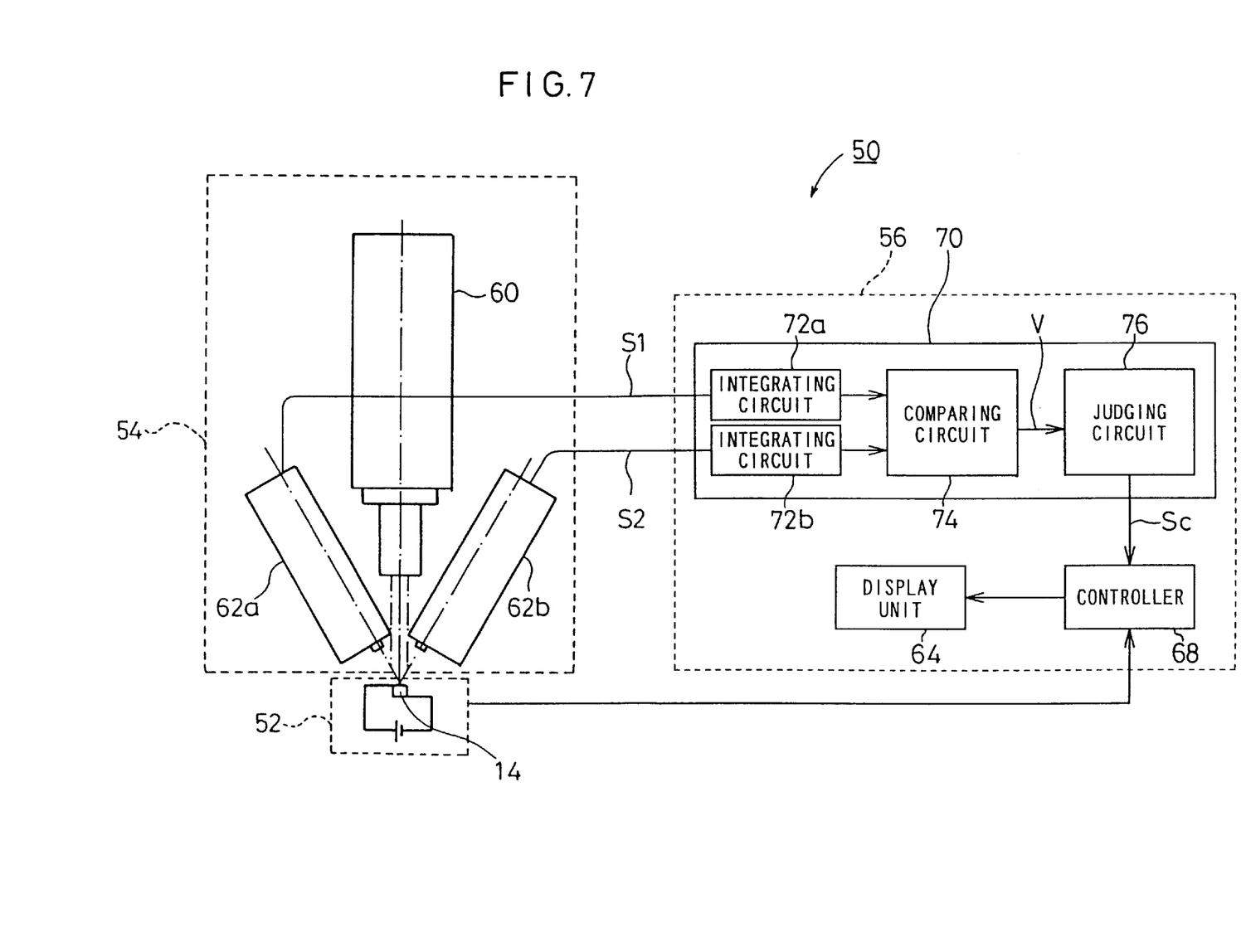
FIG. 7 shows an arrangement of the appearance inspection apparatus according to the embodiment of the present invention.

As shown in FIG. 7, the appearance inspection apparatus 50 according to the embodiment of the present invention comprises a voltage-applying unit 52, an optical detecting unit 54, and a judging unit 56. The voltage-applying unit 52 and the optical detecting unit 54 are arranged in an identical unillustrated dark room. The judging unit 56 is arranged at the outside of the dark room.

The voltage-applying unit 52 is constructed so that the voltage (for example, 1 V) for the insulation defect inspection and the constant voltage or the pulse voltage (for example, 50 V) for the withstand voltage test or the polarization treatment are successively applied to the main actuator element 14 formed in the actuator 10 supplied by an unillustrated transport mechanism. The voltage-applying unit 52 further comprises an unillustrated ammeter for measuring whether the insulation state of the main actuator element 14 is adequate or defective. The voltage-applying unit 52 is constructed to receive instruction, for example, in type of the application voltage outputted from a controller 68 so that the voltage is applied to the main actuator element 14, and, for example, the current value is outputted to the controller 68. In this embodiment, the actuator 10 is arranged so that the upper electrode 24a of each of the main actuator elements 14 is directed to the optical detecting unit 54.

The optical detecting unit 54 comprises a microscope 60 and two photodiodes (first and second photodiodes 62a, 62b). The microscope 60 is used to make positional determination between the actuator and unillustrated contact terminals for applying the voltage to the actuator. The microscope 60 is constructed so that the light upon the breakdown may be observed as well.

The first and second photodiodes 62a, 62b are installed on both sides of the microscope 60 so that each of them is directed to the upper electrode 24a of each of the main actuator elements 14 of the actuator 10. Wiring connection is arranged such that the respective detection signals S1, S2 from the first and second photodiodes 62a, 62b are supplied to the judging unit 56 disposed at the downstream stage. In the embodiment described above, the optical detecting unit 54 is constructed by the two photodiodes 62a, 62b. However, the number of photodiode or photodiodes is preferably at least one or more.

The judging unit 56 comprises a control circuit 70, the controller 68, and a display unit 64. The control circuit 70 comprises two integrating circuits (first and second integrating circuits 72a, 72b), a comparing circuit 74, and a judging circuit 76.

The first integrating circuit 72a is arranged so that the detection signal S1 (current signal or voltage signal) from the first photodiode 62a is integrated and processed, and an obtained result is supplied to the comparing circuit 74 disposed at the downstream stage. The second integrating circuit 72b is arranged so that the detection signal S2 (current signal or voltage signal) from the second photodiode 62b is integrated and processed, and an obtained result is supplied to the comparing circuit 74 disposed at the downstream stage.

The comparing circuit 74 compares the two detection signals S1, S2 having been integrated and processed as described above, and it outputs one having a larger detection value, as the output value. That is, the comparing circuit 74 is constructed to determine the appearance light amount value V.

The judging circuit 76 is constructed to compare the appearance light amount value V with the appearance reference value Va. If the appearance light amount value V is less than the appearance reference value Va, a discriminant signal Sc at a low level (logically "0") is outputted. If the appearance light amount value V is not less than the appearance reference value Va, a discriminant signal Sc at a high level (logically "1") is outputted. Wiring connection is arranged so that the discriminant signal Sc is supplied to the controller 68 disposed at the downstream stage.

The controller 68 is constructed to output, to the display unit 64, for example, the current value from the voltage-applying unit 52, the discriminant signal Sc (result of the judgement to determine whether the appearance state is adequate or defective) from the judging circuit 76, and the number of the main actuator element 14 and the type of the process recorded in the controller 68.

Figure 8:
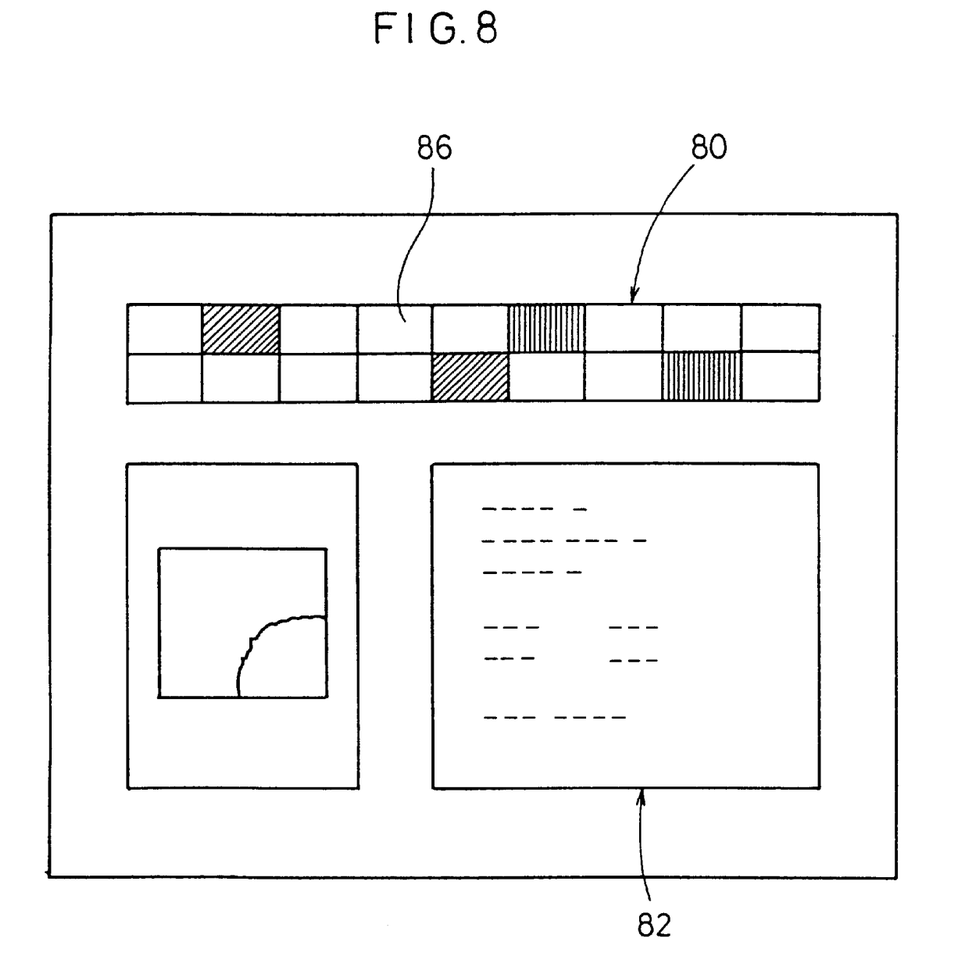
FIG. 8 illustrates a display form displayed on a display unit.
Figure 9:
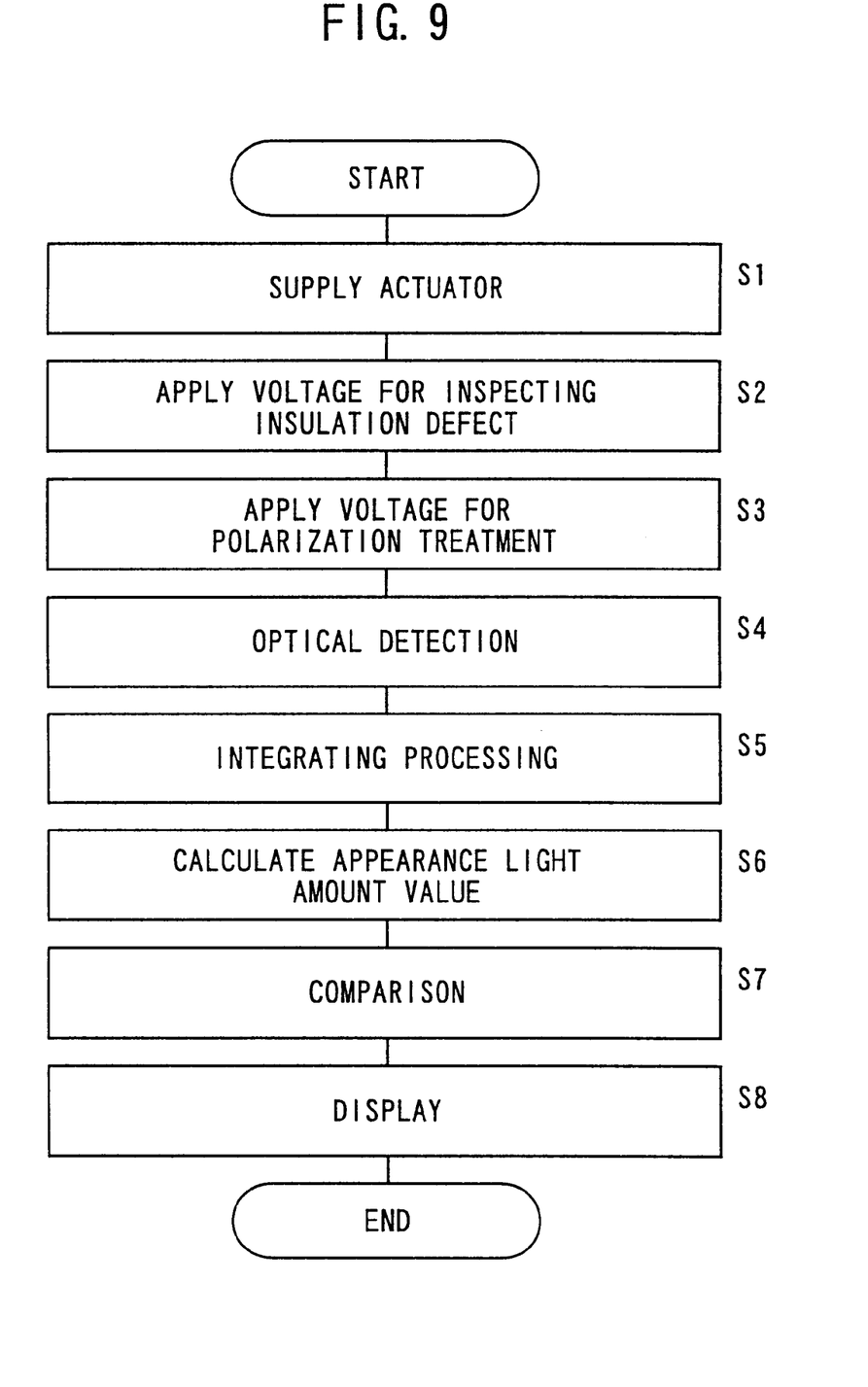
FIG. 9 shows a flow chart illustrating a processing operation of the appearance inspection apparatus according to the embodiment of the present invention.

As shown in FIG. 8, the display form of the display unit 64 comprises a judgement result display section 80 and a data display section 82.

The judgement result display section 80 includes cells 86 corresponding to the numbers of the main actuator elements 14. The judgement result is displayed on each of the cells 86. For example, the following display form is adopted for the group of cells to be displayed. That is, if the current value supplied from the ammeter of the voltage-applying unit 52 is a value which denotes the insulation defect, a red color is displayed. If the judgement result supplied from the judging unit 56 denotes the appearance defect, a green color is displayed. In the case of those other than the above, i.e., if the insulation state is "adequate", and the appearance state is also "adequate", then a white color is displayed. The display form as described above makes it possible to confirm the judgement result for the insulation state and the appearance state at a glance.

As described above, the inspection data and the presence or absence of the insulation defect and the appearance defect of the main actuator element 14 are displayed on the display unit 64. Therefore, it is possible for the inspection operator to correctly exclude or repair the main actuator element 14 having the defect, on the basis of the display.

Next, an illustrative operation of the appearance inspection apparatus 50 according to the embodiment of the present invention will be explained with reference to a flow chart shown in FIG. 9.

At first, the actuator 10 is supplied to the voltage-applying unit 52 by the aid of the unillustrated transport mechanism. At this stage, the contact terminals are allowed to make contact with the actuator 10 as the inspection objective in accordance with the instruction given by the controller 68 (step S1). Subsequently, the controller 68 is used to instruct the voltage-applying unit 52 for the type of process. The voltage (1 V) for inspecting the insulation defect is applied to each of the main actuator elements 14 of the actuator 10. The current value obtained during this process is outputted to the controller 68 (step S2).

Next, the voltage (50 V) for the withstand voltage test or the polarization treatment is applied to each of the main actuator elements 14 in the voltage-applying unit 52 (step S3). During this process, the two photodiodes 62a, 62b of the optical detecting unit 54 are used to perform optical detection simultaneously with the application of the voltage for inspecting the insulation defect. The detection signals S1, S2, which are at levels corresponding to the respective amounts of light obtained by the two photodiodes 62a, 62b, are supplied to the judging unit 56 disposed at the downstream stage (step S4).

In the judging unit 56, the detection signals S1, S2 from the two photodiodes 62a, 62b are input into the respective corresponding integrating circuits 72a, 72b respectively, and they are integrated and processed (step S5). The integrated detection signals S1, S2 are compared in the comparing circuit 74 disposed at the down stream stage to determine the appearance light amount value V (step S6). Subsequently, in the judging circuit 76, the appearance light amount value V is compared with the preset appearance reference value Va. Thus, the appearance defect is judged. The judgement result is output as the discriminant signal Sc which is, for example, logically "0" or "1" to be outputted to the controller 68 (step S7).

The information input into the controller 68 is converted into the form to be displayed on the display unit 64, followed by being output to the display unit 64. In this embodiment, the output to the display unit 64 may be collectively made at once after performing the judgement for the insulation defect and the appearance defect. Alternatively, the output may be made at any time when each information is input into the controller 68.

The display unit 64 displays the number of the main actuator element 14, the type of the process, the judgement result for the insulation defect and the appearance defect input into the controller 68, corresponding to the number of the main actuator element 14 (step S8). The inspection operator confirms the insulation defect and the appearance defect on the basis of the display to exclude or repair the main actuator element 14 having the defect.

As described above, the appearance inspection method and the appearance inspection apparatus 50 according to the embodiment of the present invention make it possible to realize a high inspection accuracy, reduction of inspection time, and simplification of the appearance inspection apparatus 50 in the inspection for the defect of the actuator 10. Further, it is also possible to inspect any integrated main actuator element 14.

The foregoing embodiment is illustrative of the case in which the light-based appearance inspection is applied to the inspection for the actuator 10. However, there is no limitation thereto. The present invention is also applicable to any electronic part provided that the electronic part is based on an element having the capacitor type structure. Even in the case of those not having the capacitor structure, the present invention is preferably applicable to parts which may have any defect resulting in the light emitted by application of a voltage.

Other than the photodiode, it is also preferable to use, for example, products based on the use of the optical semiconductor element such as CCD cameras, CCD arrays, and photomultipliers, and those which generate voltage/electric charge when the light is received, such as electron tubes.

The embodiments of the appearance inspection apparatus for electronic parts and the appearance inspection method for electronic parts according to the present invention have been explained above. However, the present invention should not be interpreted as one which is limited to the foregoing embodiments. It is possible to make, for example, alternations, modifications, and improvements in various ways without deviating from the scope of the present invention.

According to the present invention, there is provided the appearance inspection apparatus for electronic parts, for inspecting appearance defect of a measurement objective by applying an inspecting voltage to the measurement objective including electrode films formed on surfaces of a dielectric layer, the appearance inspection apparatus comprising an optical detecting means for electrically detecting an appearance state of the measurement objective on the basis of light emission caused by the measurement objective, and a judging means for judging whether the appearance state of the measurement objective is adequate or defective on the basis of a level of an electric signal supplied from the optical detecting means.

Accordingly, it is possible to realize a high inspection accuracy, reduce inspection time, and simplify of the inspection apparatus. Further, the appearance inspection apparatus is also applicable to integrated electronic parts.

Further, according to the present invention, there is provided the appearance inspection method for electronic parts, for inspecting appearance defect of a measurement objective by applying an inspecting voltage to the measurement objective including electrode films formed on surfaces of a dielectric layer, the appearance inspection method comprising an optical detecting step of electrically detecting an appearance state of the measurement objective on the basis of light emission caused by the measurement objective, and a judging step of judging whether the appearance state of the measurement objective is adequate or defective on the basis of a level of an electric signal obtained by the first step.

Accordingly, it is possible to realize a high inspection accuracy, reduce inspection time, and simplify of the inspection apparatus. Further, the appearance inspection method is also applicable to integrated electronic parts.

What is claimed is:

1. An appearance inspection apparatus for electronic parts, for inspecting appearance defect of a measurement objective by applying an inspecting voltage to said measurement objective including electrode films formed on surfaces of a dielectric layer, said appearance inspection apparatus comprising:

an optical detecting means for electrically detecting an appearance state of said measurement objective on the basis of light emission caused by said measurement objective; and a judging means for judging whether said appearance state of said measurement objective is adequate or defective on the basis of a level of an electric signal supplied from said optical detecting means.

2. The appearance inspection apparatus for electronic parts according to claim 1, wherein said optical detecting means comprises at least one or more photodiodes.

3. The appearance inspection apparatus for electronic parts according to claim 1, wherein said judging means comprises an integrating circuit for applying an integrating process to said electric signal supplied from said optical detecting means, and a comparing circuit for comparing an output level of said integrating circuit with a reference value.

4. An appearance inspection apparatus for electronic parts, for inspecting whether an appearance state of a main actuator element is adequate or defective by applying an appearance-inspecting voltage to said main actuator element including an upper electrode formed on an upper surface of a shape-retaining layer and a lower electrode formed on a lower surface of said shape-retaining layer, said appearance inspection apparatus comprising:

an optical detecting unit for electrically detecting said appearance state of said main actuator element on the basis of light emission caused by said main actuator element, and a judging unit for judging whether said appearance state of said main actuator element is adequate or defective on the basis of a level of a detection signal supplied from said optical detecting unit.

5. An appearance inspection method for electronic parts, for inspecting appearance defect of a measurement objective by applying an inspecting voltage to said measurement objective including electrode films formed on surfaces of a dielectric layer, said appearance inspection method comprising:

an optical detecting step of electrically detecting an appearance state of said measurement objective on the basis of light emission caused by said measurement objective; and a judging step of judging whether said appearance state of said measurement objective is adequate or defective on the basis of a level of an electric signal obtained by said optical detecting step.

6. The appearance inspection method for electronic parts according to claim 5, wherein at least one or more photo-diodes are used in said optical detecting step to electrically detect said light emission from said measurement objective.

7. The appearance inspection method for electronic parts according to claim 5, wherein said judging step comprises:

a first step of applying an integrating process to said electric signal obtained in said optical detecting step; and a second step of comparing an output level obtained in said first step with a reference value.

8. An appearance inspection method for electronic parts, for inspecting whether an appearance state of a main actuator element is adequate or defective by applying an appearance-inspecting voltage to said main actuator element including an upper electrode formed on an upper surface of a shape-retaining layer and a lower electrode formed on a lower surface of said shape-retaining layer, said appearance inspection method comprising the steps of:

electrically detecting said appearance state of said main actuator element on the basis of light emission caused by said main actuator element; and judging whether said appearance state of said main actuator element is adequate or defective on the basis of a level of an obtained detection signal.

9. The appearance inspection apparatus for electronic parts according to claim 2, wherein said judging means comprises an integrating circuit for applying an integrating process to said electric signal supplied from said optical detecting means, and a comparing circuit for comparing an output level of said integrating circuit with a reference value.

10. The appearance inspection method for electronic parts according to claim 6, wherein said judging step comprises:

a first step of applying an integrating process to said electric signal obtained in said optical detecting step; and a second step of comparing an output level obtained in said first step with a reference value.

* * * * *